(12) United States Patent
Lavoie et al.

(10) Patent No.: US 12,057,300 B2
(45) Date of Patent: Aug. 6, 2024

(54) APPARATUS FOR CLEANING PLASMA CHAMBERS

(71) Applicant: LAM RESEARCH CORPORATION, Fremont, CA (US)

(72) Inventors: Adrien Lavoie, Newberg, OR (US); Pulkit Agarwal, Beaverton, OR (US); Frank Loren Pasquale, Tigard, OR (US); Purushottam Kumar, Hillsboro, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 421 days.

(21) Appl. No.: 17/436,109

(22) PCT Filed: Mar. 6, 2020

(86) PCT No.: PCT/US2020/021385
§ 371 (c)(1),
(2) Date: Sep. 3, 2021

(87) PCT Pub. No.: WO2020/185557
PCT Pub. Date: Sep. 17, 2020

(65) Prior Publication Data
US 2022/0181128 A1   Jun. 9, 2022

Related U.S. Application Data

(60) Provisional application No. 62/816,820, filed on Mar. 11, 2019.

(51) Int. Cl.
*H01J 37/32* (2006.01)
*C23C 16/44* (2006.01)
*C23C 16/455* (2006.01)

(52) U.S. Cl.
CPC .... *H01J 37/32862* (2013.01); *C23C 16/4405* (2013.01); *C23C 16/45565* (2013.01); *H01J 37/32082* (2013.01); *H01J 37/32449* (2013.01)

(58) Field of Classification Search
CPC .......... H01J 37/32862; H01J 37/32082; H01J 37/32449; H01J 37/3244; H01J 37/32357;
(Continued)

(56) References Cited

U.S. PATENT DOCUMENTS 6,070,550 A * 6/2000 Ravi ................. H01L 21/02164
257/E21.271
9,508,547 B1 * 11/2016 Pasquale ........... C23C 16/45565
(Continued)

FOREIGN PATENT DOCUMENTS

JP    2010059522 A    3/2010
JP    2014012891 A    1/2014
(Continued)

OTHER PUBLICATIONS

International Search Report and Written Opinion of the ISA issued in PCT/US2020/021385, mailed Jul. 1, 2020; ISA/KR.
(Continued)

*Primary Examiner* — Rudy Zervigon

(57) ABSTRACT

Systems and methods for cleaning a processing chamber include supplying a pre-activated cleaning gas through a collar surrounding a showerhead stem into the processing chamber to clean the processing chamber. In other embodiments, a cleaning gas is supplied to the collar, and RF power is supplied to the showerhead or to a pedestal to generate plasma in the processing chamber to clean the processing chamber. In still other embodiments, an inert gas is supplied to the collar, a pre-activated cleaning gas is supplied to the showerhead stem, and RF power is supplied to the shower-
(Continued)

head or to the pedestal to generate plasma in the processing chamber to clean the processing chamber.

25 Claims, 7 Drawing Sheets

(58) Field of Classification Search
CPC .......... C23C 16/4405; C23C 16/45565; C23C 16/52
USPC .............. 118/723 E, 723 ER, 663, 695, 696; 156/345.43, 345.44, 345.45, 345.46, 156/345.47, 345.24, 345.25, 345.26, 156/345.27, 345.28, 345.29
See application file for complete search history.

(56) References Cited

U.S. PATENT DOCUMENTS

| | | | |
|---|---|---|---|
| 9,738,977 B1* | 8/2017 | Karim | ................. H01L 21/0217 |
| 2013/0344245 A1 | 12/2013 | Xia et al. | |
| 2015/0270119 A1 | 9/2015 | Yahata | |
| 2016/0035566 A1* | 2/2016 | LaVoie | ................. C23C 16/4408 438/778 |
| 2016/0079036 A1 | 3/2016 | Kang et al. | |
| 2016/0097119 A1 | 4/2016 | Cui et al. | |
| 2016/0289832 A1 | 10/2016 | Xia et al. | |
| 2017/0098556 A1* | 4/2017 | Chandrasekharan | ........................ C23C 16/4412 |
| 2017/0167017 A1 | 6/2017 | LaVoie et al. | |
| 2018/0012733 A1 | 1/2018 | Phillips et al. | |
| 2018/0073137 A1 | 3/2018 | Xavier et al. | |

FOREIGN PATENT DOCUMENTS

| | | |
|---|---|---|
| JP | 2015178644 A | 10/2015 |
| JP | 2017533599 A | 11/2017 |

OTHER PUBLICATIONS

Japanese Office Action for Japanese Application No. JP2021-554599 dated Jan. 29, 2024.

* cited by examiner

APPARATUS FOR CLEANING PLASMA CHAMBERS

CROSS-REFERENCE TO RELATED APPLICATIONS

The present disclosure is a U.S. National Phase Application under 35 U.S.C. 371 of International Application No. PCT/US2020/021385, filed on Mar. 6, 2020, which claims the benefit of U.S. Patent Application No. 62/816,820 filed on Mar. 11, 2019. The entire disclosures of the applications referenced above are incorporated herein by reference.

FIELD

The present disclosure relates generally to substrate processing systems and more particularly to cleaning plasma chambers by introducing cleaning gas via secondary purge collars above showerhead.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform substrate treatment such as deposition or etching of film on a substrate such as a semiconductor wafer. Substrate processing systems typically include a processing chamber with a substrate support (such as a pedestal, a plate, etc.) arranged therein. The substrate is arranged on the substrate support during treatment. A gas diffusion device such as a showerhead may be arranged in the processing chamber to deliver and disburse process gases and purge gases as needed.

SUMMARY

A system for cleaning a processing chamber comprises a showerhead, a collar, a gas source, a plasma generator, and a controller. The showerhead is arranged above a pedestal in the processing chamber. The showerhead includes a stem portion and a head portion. The stem portion is connected to a top plate of the processing chamber and receives a process gas during processing of a substrate mounted on the pedestal. The head portion includes a plurality of through holes to disperse the process gas during the processing of the substrate. The collar surrounds the stem portion of the showerhead, defines a cavity, and includes a plurality of slots extending outwardly from the cavity to disperse a purge gas during the processing of the substrate. The gas source to supply a cleaning gas. The plasma generator is external to the processing chamber, receives the cleaning gas from the gas source, and generates plasma. The controller ceases supplying the process gas and the purge gas respectively to the stem portion of the showerhead and the collar in response to the substrate being not processed in the processing chamber. The controller supplies the plasma to the collar and into the processing chamber through the slots to clean areas around the showerhead and in the processing chamber.

In another feature, the cleaning gas supplied during the cleaning is different than the purge gas supplied during the processing of the substrate.

In another feature, the cleaning gas includes a halogen species.

In another feature, the cleaning gas includes nitrogen trifluoride ($NF_3$) or tetrafluoroetylene ($C_2F_4$).

In another feature, the controller is configured to supply the plasma for a predetermined period of time.

In other features, prior to and subsequent to the cleaning of the processing chamber, the controller is configured to stop supplying the plasma to the collar and to supply the process gas and the purge gas respectively to the stem portion of the showerhead and the collar to process the substrate.

In still other features, a system for cleaning a processing chamber comprises a showerhead, a collar, a gas source, an RF generator, and a controller. The showerhead is arranged above a pedestal in the processing chamber. The showerhead includes a stem portion and a head portion. The stem portion is connected to a top plate of the processing chamber and receives a process gas during processing of a substrate mounted on the pedestal. The head portion includes a plurality of through holes to disperse the process gas during the processing of the substrate. The collar surrounds the stem portion of the showerhead, defines a cavity, and includes a plurality of slots extending outwardly from the cavity to disperse a purge gas during the processing of the substrate. The gas source to supply a cleaning gas. The RF generator supplies RF power. The controller ceases supplying the process gas and the purge gas respectively to the stem portion of the showerhead and the collar in response to the substrate being not processed in the processing chamber. The controller supplies the cleaning gas to the collar and into the processing chamber through the slots of the collar. The controller supplies the RF power to the showerhead to generate plasma in the processing chamber to clean areas around the showerhead and in the processing chamber.

In another feature, the cleaning gas supplied during the cleaning is different than the purge gas supplied during the processing of the substrate.

In another feature, the cleaning gas includes a halogen species.

In another feature, the cleaning gas includes nitrogen trifluoride ($NF_3$) or tetrafluoroetylene ($C_2F_4$).

In another feature, the controller is configured to supply the RF power to the showerhead for a predetermined period of time.

In another feature, the controller is configured to sequentially ground the top plate of the processing chamber, sidewalls of the processing chamber, and the pedestal.

In another feature, the controller is configured to ground the top plate of the processing chamber, sidewalls of the processing chamber, and the pedestal.

In other features, prior to and subsequent to the cleaning of the processing chamber, the controller is configured to stop supplying the cleaning gas to the collar, and to supply the process gas and the purge gas respectively to the stem portion of the showerhead and the collar to process the substrate.

In still other features, a system for cleaning a processing chamber comprises a showerhead, a collar, gas sources, a plasma generator, an RF generator, and a controller. The showerhead is arranged above a pedestal in the processing chamber. The showerhead includes a stem portion and a head portion. The stem portion is connected to a top plate of the processing chamber and receives a process gas during processing of a substrate mounted on the pedestal. The head portion includes a plurality of through holes to disperse the process gas during the processing of the substrate. The collar surrounds the stem portion of the showerhead, defines a cavity, and includes a plurality of slots extending outwardly from the cavity to disperse a purge gas during the processing of the substrate. The gas sources supply a cleaning gas and an inert gas. The plasma generator is external to the processing chamber, receives the cleaning gas, and generates a first plasma. The RF generator supplies RF power. The controller ceases supplying the process gas and the purge gas respectively to the stem portion of the showerhead and the collar in response to the substrate being not processed in the processing chamber. The controller supplies the first plasma to the stem portion of the showerhead and into the processing chamber through the plurality of through holes in the head portion of the showerhead. The controller supplies the inert gas to the collar and into the processing chamber through the slots of the collar. The controller supplies the RF power to the showerhead to generate a second plasma in the processing chamber to clean areas around the showerhead and in the processing chamber.

In another feature, the cleaning gas and the inert gas supplied during the cleaning are respectively different than the process gas and the purge gas supplied during the processing of the substrate.

In another feature, the cleaning gas includes a halogen species.

In another feature, the cleaning gas includes nitrogen trifluoride ($NF_3$) or tetrafluoroetylene ($C_2F_4$).

In another feature, the inert gas is selected from a group consisting of argon (Ar), molecular nitrogen ($N_2$), and helium (He).

In another feature, the controller is configured to supply the first plasma and the inert gas respectively to the stem portion of the showerhead and the collar for a predetermined period of time.

In another feature, the controller is configured to sequentially ground the top plate of the processing chamber, sidewalls of the processing chamber, and the pedestal.

In another feature, the controller is configured to ground the top plate of the processing chamber, sidewalls of the processing chamber, and the pedestal.

In other features, prior to and subsequent to the cleaning of the processing chamber, the controller is configured to stop supplying the first plasma and the inert gas respectively to the stem portion of the showerhead and the collar, and to supply the process gas and the purge gas respectively to the stem portion of the showerhead and the collar to process the substrate.

In still other features, a system for cleaning a processing chamber comprises a showerhead, a collar, a gas source, an RF generator, and a controller. The showerhead is arranged above a pedestal in the processing chamber. The showerhead includes a stem portion and a head portion. The stem portion is connected to a top plate of the processing chamber and receives a process gas during processing of a substrate mounted on the pedestal. The head portion includes a plurality of through holes to disperse the process gas during the processing of the substrate. The collar surrounds the stem portion of the showerhead, defines a cavity, and includes a plurality of slots extending outwardly from the cavity to disperse a purge gas during the processing of the substrate. The gas source to supply a cleaning gas. The RF generator supplies RF power. The controller ceases supplying the process gas and the purge gas respectively to the stem portion of the showerhead and the collar in response to the substrate being not processed in the processing chamber. The controller supplies the cleaning gas to the collar and into the processing chamber through the slots of the collar. The controller supplies the RF power to the pedestal to generate plasma in the processing chamber to clean areas around the showerhead and in the processing chamber.

In another feature, the cleaning gas supplied during the cleaning is different than the purge gas supplied during the processing of the substrate.

In another feature, the cleaning gas includes a halogen species.

In another feature, the cleaning gas includes nitrogen trifluoride ($NF_3$) or tetrafluoroetylene ($C_2F_4$).

In another feature, the controller is configured to supply the RF power to the pedestal for a predetermined period of time.

In another feature, the controller is configured to sequentially ground the top plate of the processing chamber, sidewalls of the processing chamber, and the showerhead.

In another feature, the controller is configured to ground the top plate of the processing chamber, sidewalls of the processing chamber, and the showerhead.

In other features, prior to and subsequent to the cleaning of the processing chamber, the controller is configured to stop supplying the cleaning gas to the collar, and to supply the process gas and the purge gas respectively to the stem portion of the showerhead and the collar to process the substrate.

In still other features, a system for cleaning a processing chamber comprises a showerhead, a collar, gas sources, a plasma generator, an RF generator, and a controller. The showerhead is arranged above a pedestal in the processing chamber. The showerhead includes a stem portion and a head portion. The stem portion is connected to a top plate of the processing chamber and receives a process gas during processing of a substrate mounted on the pedestal. The head portion includes a plurality of through holes to disperse the process gas during the processing of the substrate. The collar surrounds the stem portion of the showerhead, defines a cavity, and includes a plurality of slots extending outwardly from the cavity to disperse a purge gas during the processing of the substrate. The gas sources supply a cleaning gas and an inert gas. The plasma generator is external to the processing chamber, receives the cleaning gas, and generates a first plasma. The RF generator supplies RF power. The controller ceases supplying the process gas and the purge gas respectively to the stem portion of the showerhead and the collar in response to the substrate being not processed in the processing chamber. The controller supplies the first plasma to the stem portion of the showerhead and into the processing chamber through the plurality of through holes in the head portion of the showerhead. The controller supplies the inert gas to the collar and into the processing chamber through the slots of the collar. The controller supplies the RF power to the pedestal to generate a second plasma in the processing chamber to clean areas around the showerhead and in the processing chamber.

In another feature, the cleaning gas and the inert gas supplied during the cleaning are respectively different than the process gas and the purge gas supplied during the processing of the substrate.

In another feature, the cleaning gas includes a halogen species.

In another feature, the cleaning gas includes nitrogen trifluoride ($NF_3$) or tetrafluoroetylene ($C_2F_4$).

In another feature, the inert gas is selected from a group consisting of argon (Ar), molecular nitrogen ($N_2$), and helium (He).

In another feature, the controller is configured to supply the first plasma and the inert gas respectively to the stem portion of the showerhead and the collar for a predetermined period of time.

In another feature, the controller is configured to sequentially ground the top plate of the processing chamber, sidewalls of the processing chamber, and the showerhead.

In another feature, the controller is configured to ground the top plate of the processing chamber, sidewalls of the processing chamber, and the showerhead.

In other features, prior to and subsequent to the cleaning of the processing chamber, the controller is configured to stop supplying the first plasma and the inert gas respectively to the stem portion of the showerhead and the collar, and to supply the process gas and the purge gas respectively to the stem portion of the showerhead and the collar to process the substrate.

In still other features, a system for cleaning a processing chamber comprises a showerhead, a collar, a gas supply system, and a plasma generator. The showerhead is arranged above a pedestal in the processing chamber. The showerhead includes a stem portion and a head portion. The stem portion is connected to a top plate of the processing chamber and receives a process gas during processing of a substrate mounted on the pedestal. The head portion includes a plurality of through holes to disperse the process gas during the processing of the substrate. The collar surrounds the stem portion of the showerhead, defines a cavity, and includes a plurality of slots extending outwardly from the cavity to disperse a purge gas during the processing of the substrate. The gas supply system supplies the process gas and the purge gas respectively to the stem portion of the showerhead and the collar during the processing of the substrate. The gas supply system supplies a cleaning gas during the cleaning of the processing chamber. The plasma generator is external to the processing chamber, receives the cleaning gas from the gas supply system, generates plasma, and supplies the plasma to the collar and into the processing chamber through the slots to clean areas around the showerhead and in the processing chamber.

In another feature, the cleaning gas supplied during the cleaning is different than the purge gas supplied during the processing of the substrate.

In another feature, the cleaning gas includes a halogen species.

In another feature, the cleaning gas includes nitrogen trifluoride ($NF_3$) or tetrafluoroetylene ($C_2F_4$).

In another feature, the plasma generator is configured to supply the plasma for a predetermined period of time.

In still other features, a system for cleaning a processing chamber comprises a showerhead, a collar, a gas supply system, and an RF generator. The showerhead is arranged above a pedestal in the processing chamber. The showerhead includes a stem portion and a head portion. The stem portion is connected to a top plate of the processing chamber and receives a process gas during processing of a substrate mounted on the pedestal. The head portion includes a plurality of through holes to disperse the process gas during the processing of the substrate. The collar surrounds the stem portion of the showerhead, defines a cavity, and includes a plurality of slots extending outwardly from the cavity to disperse a purge gas during the processing of the substrate. The gas supply system supplies the process gas and the purge gas respectively to the stem portion of the showerhead and the collar during the processing of the substrate. The gas supply system supplies a cleaning gas to the collar and into the processing chamber through the slots of the collar during the cleaning of the processing chamber. The RF generator supplies RF power to the showerhead or to the pedestal to generate plasma in the processing chamber to clean areas around the showerhead and in the processing chamber.

In another feature, the cleaning gas supplied during the cleaning is different than the purge gas supplied during the processing of the substrate.

In another feature, the cleaning gas includes a halogen species.

In another feature, the cleaning gas includes nitrogen trifluoride ($NF_3$) or tetrafluoroetylene ($C_2F_4$).

In another feature, the RF generator is configured to supply the RF power to the showerhead or to the pedestal for a predetermined period of time.

In still other features, a system for cleaning a processing chamber comprises a showerhead, a collar, a gas supply system, a plasma generator, and an RF generator. The showerhead is arranged above a pedestal in the processing chamber. The showerhead includes a stem portion and a head portion. The stem portion is connected to a top plate of the processing chamber and receives a process gas during processing of a substrate mounted on the pedestal. The head portion includes a plurality of through holes to disperse the process gas during the processing of the substrate. The collar surrounds the stem portion of the showerhead, defines a cavity, and includes a plurality of slots extending outwardly from the cavity to disperse a purge gas during the processing of the substrate. The gas supply system supplies the process gas and the purge gas respectively to the stem portion of the showerhead and the collar during the processing of the substrate. The gas supply system supplies an inert gas to the collar and into the processing chamber through the slots of the collar during the cleaning of the processing chamber. The gas supply system supplies a cleaning gas during the cleaning of the processing chamber. The plasma generator is external to the processing chamber, receives the cleaning gas from the gas supply system, generates a first plasma, and supplies the first plasma to the stem portion of the showerhead and into the processing chamber through the plurality of through holes in the head portion of the showerhead. The RF generator supplies the RF power to the showerhead or to the pedestal to generate a second plasma in the processing chamber to clean areas around the showerhead and in the processing chamber.

In another feature, the cleaning gas and the inert gas supplied during the cleaning are respectively different than the process gas and the purge gas supplied during the processing of the substrate.

In another feature, the cleaning gas includes a halogen species.

In another feature, the cleaning gas includes nitrogen trifluoride ($NF_3$) or tetrafluoroetylene ($C_2F_4$).

In another feature, the inert gas is selected from a group consisting of argon (Ar), molecular nitrogen ($N_2$), and helium (He).

In other features, the gas from the gas supply system is configured to supply the inert gas to the collar for a predetermined period of time. The plasma generator is configured to supply the first plasma to the stem portion of the showerhead for the predetermined period of time. The RF generator is configured to supply the RF power to the showerhead or to the pedestal for the predetermined period of time.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
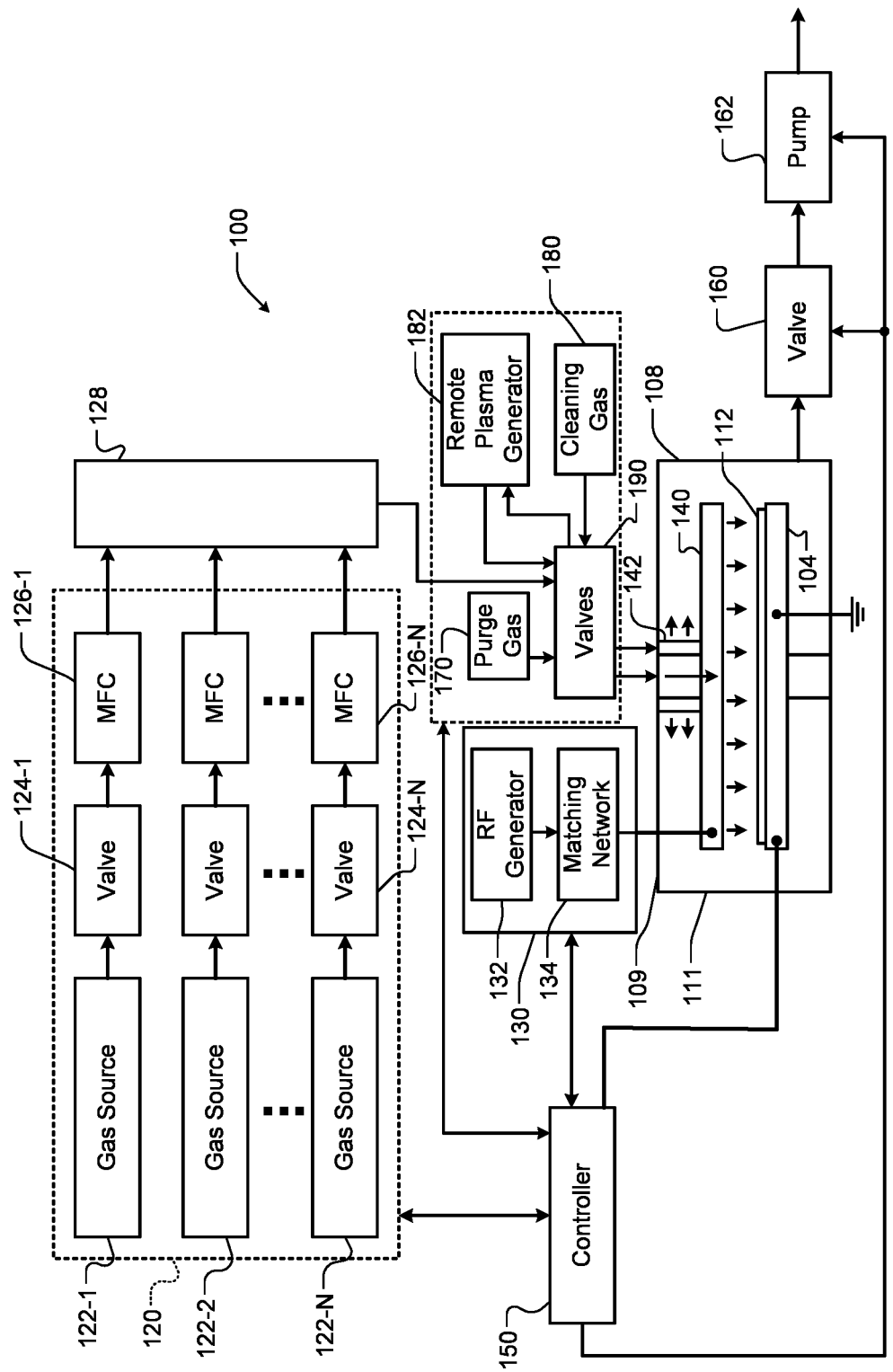
FIG. 1 shows a functional block diagram of an example of a substrate processing system comprising a processing chamber.

In some applications, a film may be deposited on the substrate using plasma-enhanced chemical vapor deposition (PECVD) or plasma-enhanced atomic layer deposition (PEALD). During PEALD, one or more cycles are performed to deposit the film on the substrate. Each PEALD cycle typically includes a sequence of precursor dosing, dose purging, RF plasma dosing, and RF purging steps. During deposition, a process gas may be delivered to the processing chamber using the showerhead. During RF plasma dosing, RF power is supplied to the showerhead, and the substrate support is grounded (or vice versa).

In each PEALD cycle, an inert gas (e.g., argon (Ar) or molecular nitrogen ($N_2$)) is used as a primary burst purge gas that flows through the showerhead in the dose purging and RF purging steps. In addition, oxygen ($O_2$) or molecular nitrogen ($N_2$) is continuously supplied through a backside of the showerhead as a secondary purge gas in all the steps of each PEALD cycle. The secondary purging prevents any undesirable deposition at remote areas such as the backside of the showerhead, a top plate of the processing chamber, sidewalls of the processing chamber, etc.

The processing chamber typically comprises upper and lower surfaces and side walls. The showerhead includes a cylindrical base portion defining a gas plenum. A faceplate is arranged on one side of the gas plenum and includes a plurality of spaced through holes. The showerhead further includes a hollow stem portion that is connected at one end to the upper surface of the processing chamber and at an opposite end to a center of the cylindrical base portion. The stem portion of the showerhead delivers the process gas to the gas plenum in the cylindrical base. The process gas flows through the spaced through holes of the faceplate and is uniformly dispersed relative to a substrate arranged on a substrate support located below the showerhead.

A collar arranged around the stem portion may be used to connect the stem portion to the upper surface of the processing chamber. The collar may include one or more gas slits that deliver and disperse the secondary purge gas into the processing chamber between the cylindrical base portion of the showerhead and the upper surface of the processing chamber during processing. A gap is defined between radially outer edges of the cylindrical base portion of the showerhead and the sidewalls of the processing chamber. The secondary purge gas flows through the slits on the collar, and the gap and is then evacuated via an exhaust port. Accordingly, the collar may also be referred to as a secondary purge collar.

Typically, oxygen is delivered through the collar while processing substrates since oxygen suppresses parasitic plasma from developing above and on the backside of the showerhead. Nonetheless, parasitic plasma causes residue buildup on a back-plate and sides of the showerhead. Cleaning the back-plate and sides of the showerhead can be difficult.

The present disclosure discloses systems and methods for delivering a cleaning gas or an inert gas via the collar to areas of the processing chamber that are difficult to clean (e.g., back and side of the showerhead). The systems and methods leverage the collar that is used to deliver oxygen ($O_2$) or molecular nitrogen ($N_2$) during substrate processing. During a chamber cleaning process, the gas supply to the showerhead and the collar is switched, and the collar is used to deliver either a reactive cleaning gas (e.g., $NF_3$, $C_2F_4$, etc.) or an inert gas (e.g., Ar, $N_2$, or He) above and over the showerhead (i.e., areas that are difficult to clean).

In practice, switching the gas supply and supplying gases as stated above increase partial pressure of the reactive cleaning gas species to the difficult to clean areas and reduces overall time to clean the processing chamber. Further, delivering the inert gas through the secondary purge collar can increase the lifetime of fluorine radicals (delivered from the showerhead faceplate) by increasing collisional distance between fluorine species via dilution.

The cleaning gas or the inert gas may be supplied in different ways. In one example, the cleaning gas may be pre-activated in a remote plasma generator, and the pre-activated cleaning gas is then delivered into the collar. In another example, the cleaning gas is delivered via the collar and is activated in-situ by applying RF power to the showerhead with the pedestal grounded. In yet another example, the pre-activated cleaning gas is delivered through the showerhead, and the inert gas is supplied through the collar in order to increase a mean free path of fluorine radicals delivered from the showerhead, which increases the partial pressure of the fluorine radicals above and behind the showerhead. These and other features of the present disclosure are described below in detail.

Figure 8:
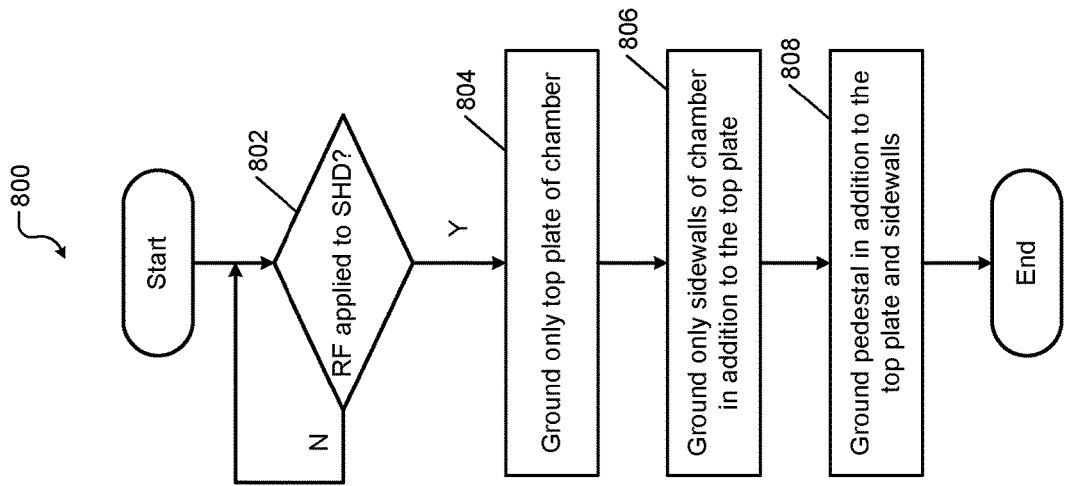
FIGS. 7 and 8 show different grounding methods that can be used during the cleaning of the processing chamber.

The present disclosure is organized as follows. An example of an atomic layer deposition (ALD) processing chamber is shown and described with reference to FIG. 1. An example of the collar is shown and described in detail with reference to FIG. 2. An arrangement of valves to supply various gases during substrate processing and chamber cleaning operations is shown and described with reference to FIG. 3. Various methods of cleaning the processing chamber are shown and described with reference to FIGS. 3-6. Different grounding methods that can be used during the cleaning of the processing chamber are shown in FIGS. 7 and 8. A flow model for the processing chamber is shown and described with reference to FIG. 9. FIG. 10 shows an alternate configuration with grounded showerhead and powered pedestal.

FIG. 1 shows an example of a substrate processing system 100 including a processing chamber 108. A substrate support (e.g., a pedestal) 104 is arranged within the processing chamber 108. A substrate 112 is arranged on the substrate support 104 during processing. A gas distribution device such as a showerhead 140 is arranged in the processing chamber 108 above the substrate support 104.

A gas delivery system 120 includes gas sources 122-1, 122-2, ..., and 122-N (collectively gas sources 122) that are connected to valves 124-1, 124-2, ..., and 124-N (collectively valves 124) and mass flow controllers 126-1, 126-2, ..., and 126-N (collectively MFCs 126). The MFCs 126 control flow of gases from the gas sources 122 to a manifold 128 where the gases mix. An output of the manifold 128 is supplied to the showerhead 140. The showerhead 140 includes an internal plenum and gas through holes. The showerhead 140 introduces and distributes process gases via the gas through holes into the processing chamber 108.

An RF generating system 130 generates and outputs an RF voltage to the showerhead 140 or the substrate support 104 (the other is DC grounded, AC grounded or floating). For example only, the RF generating system 130 may include an RF voltage generator 132 that generates the RF voltage that is fed by a matching network 134 to the showerhead 140 or the substrate support 104. Plasma is generated when process gases and RF power are supplied to the showerhead 140.

In some examples, during each ALD cycle while processing the substrate 112, an inert gas such as argon (Ar) or molecular nitrogen ($N_2$) may be used as primary purge gas flowing through the showerhead 140 in the dose purging and RF purging steps. In addition, molecular oxygen ($O_2$) or molecular nitrogen ($N_2$) may be continuously flowing through the backside of the showerhead 140 as a secondary purge in all the ALD steps to prevent or minimize any undesirable deposition at remote areas such as the backside of the showerhead 140, and the walls and the top plate 109 of the processing chamber 108.

A controller 150 controls the flow of process gases; monitors process parameters such as temperature, pressure, power, etc.; and controls striking and extinguishing plasma, removal of reactants, etc. The controller 150 controls gas delivery from the gas delivery system 120 to supply process and/or purge gases at predetermined intervals during a process. The controller 150 controls pressure in the processing chamber 108 and/or evacuation of reactants using the valve 160 and the pump 162. The controller 150 controls the temperature of the substrate support 104 and the substrate 112 based on temperature feedback from sensors (not shown) in the substrate support 104 and/or sensors (not shown) measuring coolant temperature. A purge gas source 170 and a corresponding valve (shown in FIG. 3) may be used by the controller 150 to selectively supply the secondary purge gas to a collar 142 as described below with reference to FIG. 2.

In addition, the substrate processing system 100 includes a cleaning gas source 180 and a remote plasma generator 182. For example, the remote plasma generator 182 may include an inductively coupled plasma (ICP) chamber that generates plasma when the cleaning gas source 180 supplies a cleaning gas. Accordingly, the remote plasma generator 182 may be called remote plasma clean (RPC-ICP) generator. Throughout the present disclosure, the plasma generated by the remote plasma generator 182 is referred to as a pre-activated cleaning gas. The pre-activated cleaning gas can also be called remote plasma clean (RPC) gas.

The controller 150 controls the supply of the cleaning gas from the cleaning gas source 180 and, in some examples, the supply of the pre-activated cleaning gas from the remote plasma generator 182 to clean the processing chamber 108 as described below with reference to FIGS. 3-6.

The substrate processing system 100 further includes a plurality of valves 190 to allow delivery of process and purge gases during substrate processing and to allow delivery of the pre-activated cleaning gas, an inert gas, and the cleaning gas during chamber cleaning. The controller 150 controls the valves 190 to supply appropriate process and purge gases to the processing chamber 108 while processing the substrate 112 as described below with reference to FIGS. 3-6. The controller 150 controls the valves 190 to supply other suitable gases to the processing chamber 108 while cleaning the processing chamber 108 as described below with reference to FIGS. 3-6. A combination or sub-combination of elements 120, 128, 170, 180, 190 may be collectively called a gas supply system. In some implementations, the gas supply system may include element 150 and/or element 182.

Figure 2:
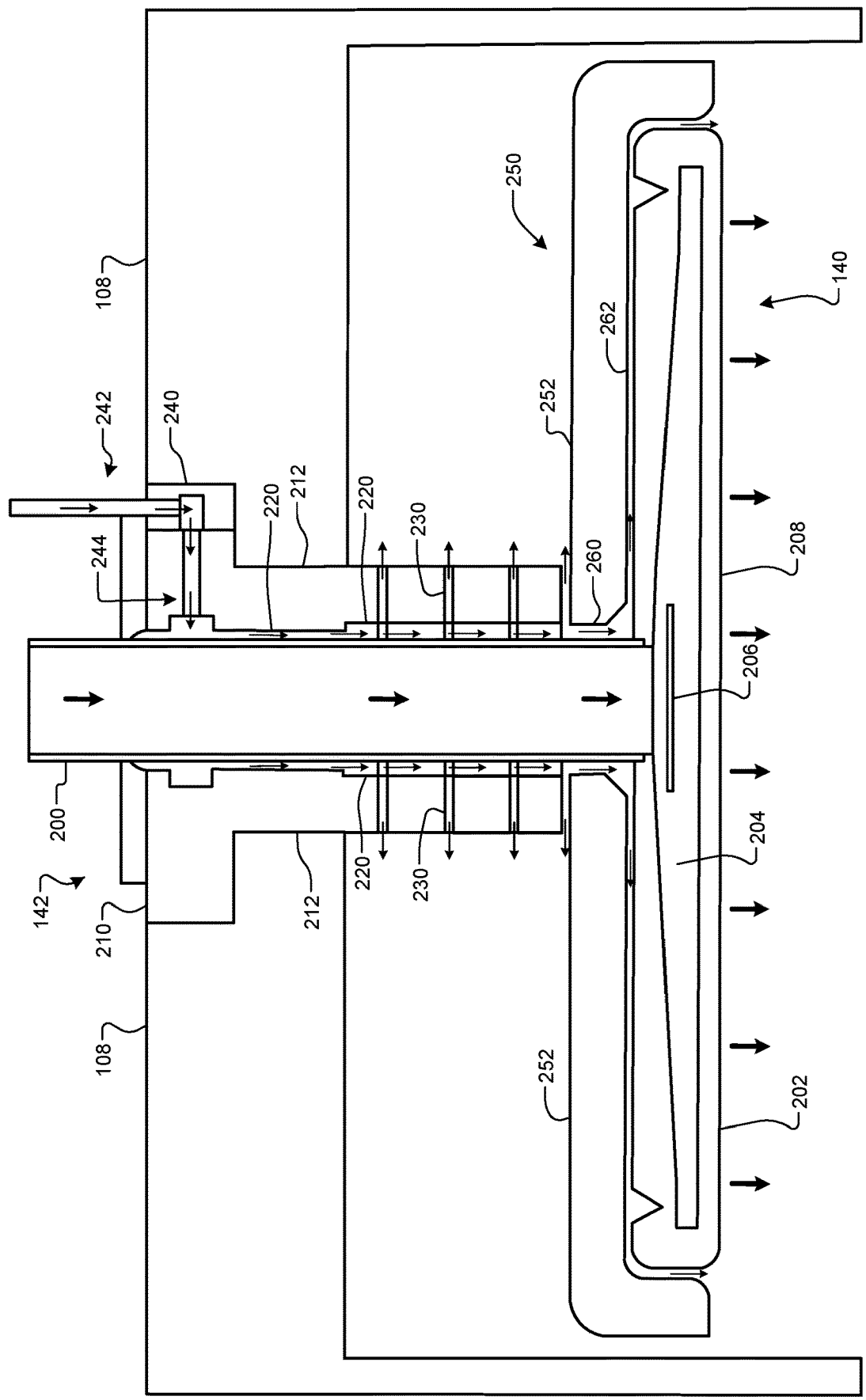
FIG. 2 shows an example of a collar used around a showerhead in the processing chamber of FIG. 1.

FIG. 2 shows the showerhead 140 and the collar 142 in further detail. The showerhead 140 includes a stem portion 200 and a head portion 202. The head portion 202 defines an inner cavity 204. Fluids such as precursor or purge gases flow through the stem portion 200, onto a dispersion plate 206, and into the inner cavity 204. The fluids then pass through spaced holes 208 in a bottom surface of the head portion 202 and into the processing chamber 108.

The stem portion 200 of the showerhead 140 is connected to the top wall (i.e., the top plate 109) of the processing chamber 108 by the collar 142. The collar 142 has a generally "T"-shaped cross section and includes a head portion 210 and a stem portion 212. The collar 142 defines an inner cavity 220 that is cylinder-shaped and that receives the stem portion 200 of the showerhead 140. A plurality of slots 230 are formed in the stem portion 212 of the collar 142. The slots 230 allow fluids such as purge gases to flow from the inner cavity 220 to an outer surface of the stem portion 212 of the collar 142 and into the area above the showerhead 140 and into the processing chamber 108.

A fluid connector 240 may be connected to an edge of the head portion 210 of the collar 142 and is used to supply fluid such as purge gas while processing the substrate 112. The fluid connector 240 includes one or more conduits and/or connectors that are generally identified at 242. The head portion 210 of the collar 142 includes conduits and/or connectors that are generally identified at 244 to direct the flow of fluids to the inner cavity 220 of the collar 142.

A plate 250 is arranged between the head portion 202 of the showerhead 140 and the collar 142. The plate 250 includes an upper surface 252, a centering opening or bore 260, and a bottom surface 262. In some examples, the plate 250 is made of ceramic. A thickness of the plate 250 may be selected to minimize material and capacitive coupling to ground or parasitic plasma. The upper surface 252 of the plate 250 is spaced from a bottom edge of the collar 142 to allow fluids to pass there between. The centering bore 260 is also spaced from the stem portion 202 of the showerhead 140 to allow fluids to pass there between. The bottom surface 262 of the plate 250 is spaced from the upper surface of the showerhead 140 to allow fluids to flow there between. In some examples, the plate 250 may be omitted and the processing chamber 108 may be operated without the plate 250.

Flowing the purge gas through the collar 142 inhibits process deposition chemistry from entering areas in the cavity 220 to prevent unwanted film deposition there. Dimensions of the slots 230 and other gaps may be selected to prevent plasma light-up therein and to allow for a Peclet condition to be satisfied to prevent back diffusion for the desired gas flow rates.

The controller 150 utilizes the showerhead 140 and the collar 142 differently during the cleaning processes described below than during the processing of the substrate 112. The controller 150 uses an arrangement of valves (shown and described below with reference to FIG. 3) to alter the utilization of the showerhead 140 and the collar 142 while cleaning the processing chamber 108.

Figure 3:
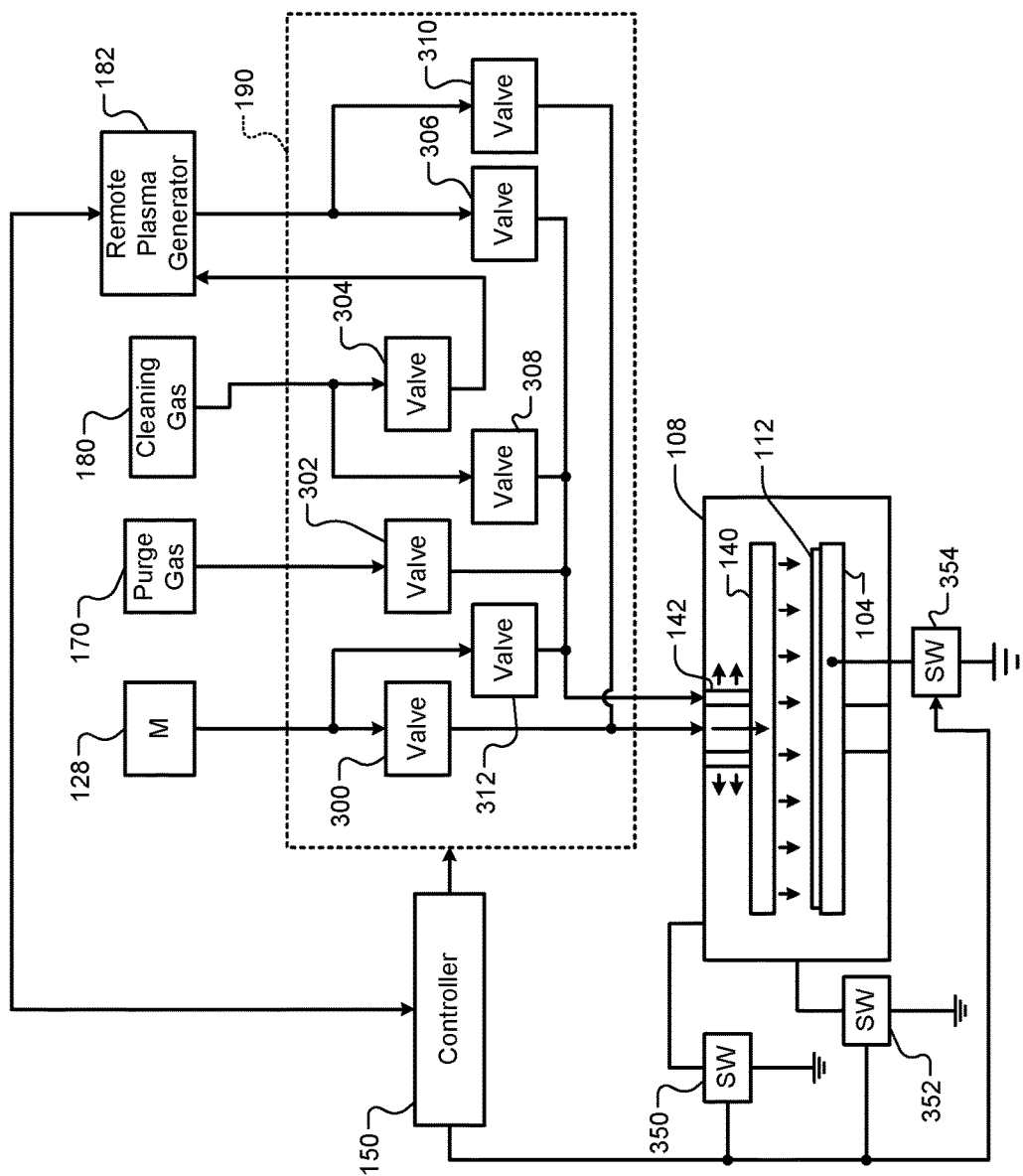
FIG. 3 shows an arrangement of valves used in the substrate processing system of FIG. 1 to supply gases during processing of substrates in the processing chamber and during cleaning of the processing chamber.

FIG. 3 shows an arrangement of various valves used to supply different gases to the showerhead 140 and the collar 142 during chamber cleaning operations. The valves 190 switch gas supplies such as process gas, purge gas, pre-activated cleaning gas, inert gas, and the cleaning gas to the showerhead 140 and the collar 142 during substrate processing and chamber cleaning operations. The valves 190 comprise valves 300-312 that route various gases to the showerhead 140 and the collar 142 during substrate processing and chamber cleaning operations. The controller 150 controls the valves 300-312 during substrate processing and chamber cleaning operations as follows.

During substrate processing, process gases are supplied to the showerhead 140, and purge gases are supplied to the collar 142. Accordingly, during substrate processing, the controller 150 turns on valves 300 and 302 and turns off valves 304-312. Thus, during substrate processing, the process gas is supplied from the manifold 128 to the showerhead 140 via valve 300, and the purge gas is supplied from the purge gas source 170 to the collar 142 via valve 302.

During cleaning operation, the controller 150 turns off valves 300 and 302 to turn off the supply of the process gas from the manifold 128 and the purge gas from the purge gas source 170 respectively to the showerhead 140 and the collar 142. The controller 150 uses one of three methods described below to clean the processing chamber 108. During each method, valves 300 and 302 remain turned off, and the controller 150 turns on valves 304-312 as described below. After the cleaning operation is completed using any of the three methods, the controller 150 turns off valves 304-312 and turns on valves 300 and 302 while processing the substrate 112 in the processing chamber 108.

In a first cleaning method, the cleaning gas from the cleaning gas source 180 is supplied to the remote plasma generator 182 and pre-activated cleaning gas is generated. The controller 150 turns on valve 304 to supply the cleaning gas from the cleaning gas source 180 to the remote plasma generator 182. The controller 150 then turns off valve 306 to supply the pre-activated cleaning gas from the remote plasma generator 182 to the collar 142 of the showerhead 140. In the first cleaning method, valves 300, 302, and 308-312 remain off.

The pre-activated cleaning gas is dispersed through the collar 142 above and over the backside of the showerhead 140 and into the processing chamber 108. The pre-activated cleaning gas reacts with any residue that may have been deposited in these areas during substrate processing. The pre-activated cleaning gas cleans these areas. The pre-activated cleaning gas is supplied to the collar 142 for a predetermined period of time after which valves 304 and 306 are turned off. Subsequently, the controller 150 turns on valves 300 and 302 to supply the process and purge gases respectively to the showerhead 140 and the collar 142 while processing the substrate 112 in the processing chamber 108.

In a second cleaning method, the cleaning gas is supplied from the cleaning gas source 180 directly to the collar 142 of the showerhead 140, and RF power is supplied to the showerhead 140 to activate the cleaning gas in the processing chamber 108. During the second cleaning method, valves 300-306, 310, and 312 remain off.

The controller 150 turns on valve 308 to supply the cleaning gas from the cleaning gas source 180 to the collar 142 of the showerhead 140. The controller 150 supplies RF power to the showerhead 140 to activate the cleaning gas dispersing from the collar 142 into the processing chamber 108. The activated cleaning gas reacts with any residue that may have been deposited above and over the backside of the showerhead 140 and elsewhere in the processing chamber 108 during substrate processing. The activated cleaning gas cleans these areas.

The cleaning gas is supplied to the collar 142 and the RF power is supplied to the showerhead 140 for a predetermined period of time. After the predetermined period of time, valve 308 and the RF power are turned off. Subsequently, the controller 150 turns on valves 300 and 302 to supply the process and purge gases respectively to the showerhead 140 and the collar 142 while processing the substrate 112 in the processing chamber 108.

In some implementations, when the controller 150 supplies the RF power to the showerhead 140 to activate the cleaning gas dispersing from the collar 142 into the processing chamber 108, the controller 150 may sequentially ground different portions of the processing chamber 108. For example, the top plate 109 and the sidewalls 111 of the processing chamber 108 may be connected to ground via switches 350 and 352, and the pedestal 104 may be connected to ground via a switch 354. The controller 150 may sequentially ground the top plate 109 and the sidewalls 111 of the processing chamber 108 and the pedestal 104 by selectively turning on and off switches 350, 352, and 354. The sequential grounding allows the plasma cleaning to be focused in the specific areas or regions of the processing chamber 108 that are grounded.

For example, the controller 150 may initially ground only the top plate 109 of the processing chamber 108 that is above the showerhead 140 by turning on the switch 350 and turning off switches 352 and 354. Subsequently, the controller 150 may ground only the sidewalls 111 of the processing chamber 108 by turning on the switch 352 and turning off switches 350 and 354. Subsequently, the controller 150 may ground only the pedestal 104 by turning on the switch 354 and turning off switches 350 and 352. In some examples, a different sequence may be followed.

Alternatively, the controller 150 may initially ground only the top plate 109 of the processing chamber 108 that is above the showerhead 140 by turning on the switch 350 and turning off switches 352 and 354. Subsequently, the controller 150 may additionally ground only the sidewalls 111 of the processing chamber 108 by turning on the switch 352 while keeping the switch 350 turned on and switch 354 turned off. Subsequently, the controller 150 may additionally ground the pedestal 104 by turning on the switch 354 while keeping switches 350 and 352 turned on. In some examples, a different sequence may be followed. In some implementations, the body (i.e., the top plate 109 and the sidewalls 111) of the processing chamber 108 and the pedestal 104 may be grounded together (i.e., by turning on switches 350-354 together) instead of in a sequence.

In a third cleaning method, the cleaning gas from the cleaning gas source 180 is first pre-activated in the remote plasma generator 182. The controller 150 turns on valve 304 to supply the cleaning gas from the cleaning gas source 180 to the remote plasma generator 182. The controller 150 then turns on valve 310 to supply the pre-activated cleaning gas from the remote plasma generator 182 to the showerhead 140 of the processing chamber 108.

Additionally, the controller 150 supplies an inert gas to the collar 142 of the showerhead 140. The inert gas is typically supplied from the manifold 128 to the showerhead 140 during substrate processing. To supply the inert gas from the manifold 128 to the collar 142 instead, the controller 150 turns on valve 312. In the third cleaning method, valves 300-308 remain off.

The controller 150 supplies RF power to the showerhead 140. The RF power activates the inert gas dispersing from the collar 142 above and over the backside of the showerhead 140 and into the processing chamber 108. The activated inert gas allows the pre-activated cleaning gas entering from the showerhead 140 into the processing chamber 108 to react with any residue that may have been deposited above and over the backside of the showerhead 140 and elsewhere in the processing chamber 108 during substrate processing. The pre-activated cleaning gas and the plasma generated using the inert gas clean these areas.

The pre-activated cleaning gas and the inert gas are respectively supplied to the showerhead 140 and the collar 142, and the RF power is supplied to the showerhead 140 for a predetermined period of time. After the predetermined period of time, the controller 150 turns off valves 310 and 312 and turns off the RF power to the showerhead 140. Subsequently, the controller 150 turns on valves 300 and 302 to supply the process and purge gases respectively to the showerhead 140 and the collar 142 while processing the substrate 112 in the processing chamber 108. In some implementations, during the third cleaning method, the controller 150 may use the sequential grounding described above with reference to the second cleaning method.

Figure 4:
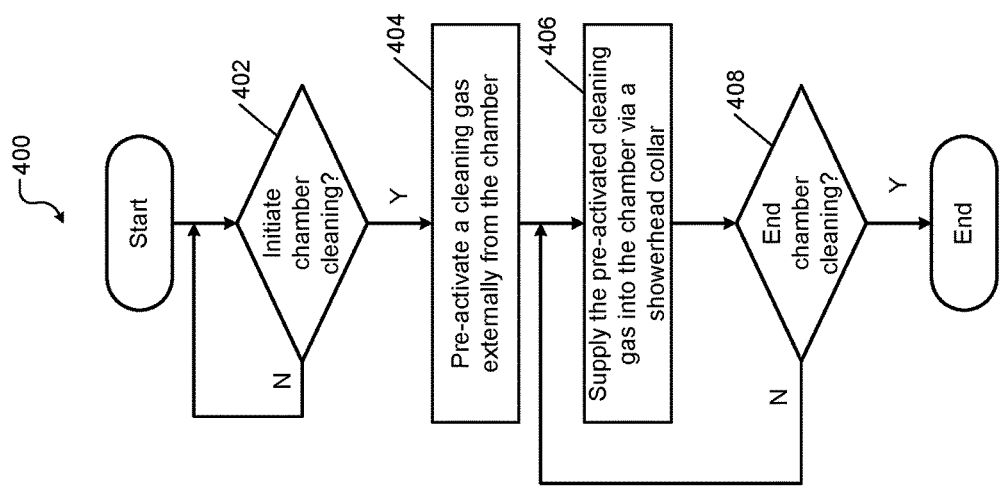

FIG. 4 shows a first method 400 for cleaning the areas above and over the backside of the showerhead 140 and in the processing chamber 108. The method 400 is performed by the controller 150. At 402, the method 400 determines whether to clean the processing chamber 108. At 404, if the processing chamber 108 is to be cleaned, the method 400 initially turns off the supply of the process gas and the purge gas respectively to the showerhead 140 and the collar 142, which are used while processing substrates in the processing chamber 108. The method 400 then pre-activates the cleaning gas in the remote plasma generator 182.

At 406, the method 400 supplies the pre-activated cleaning gas from the remote plasma generator 182 to the collar 142 of the showerhead 140. At this point, no fluid is supplied to the showerhead 140 and into the processing chamber 108 through the showerhead 140. The pre-activated cleaning gas is dispersed through the collar 142 in areas above and over the backside of the showerhead 140 and into the processing chamber 108. The pre-activated cleaning gas reacts with any residue that may have been deposited in these areas while processing substrates and cleans these areas.

The method 400 supplies the pre-activated cleaning gas for a predetermined time period within which the cleaning operation is completed. At 408, the method 400 checks whether the predetermined time period has elapsed, after which the method 400 stops the cleaning operation. At this point, the method 400 stops supplying the pre-activated cleaning gas to the collar 142 of the showerhead 140. Subsequently, substrates can be processed in the processing chamber 108, and the process gas and the purge gas can be respectively supplied to the showerhead 140 and the collar 142 while processing the substrates.

Figure 5:
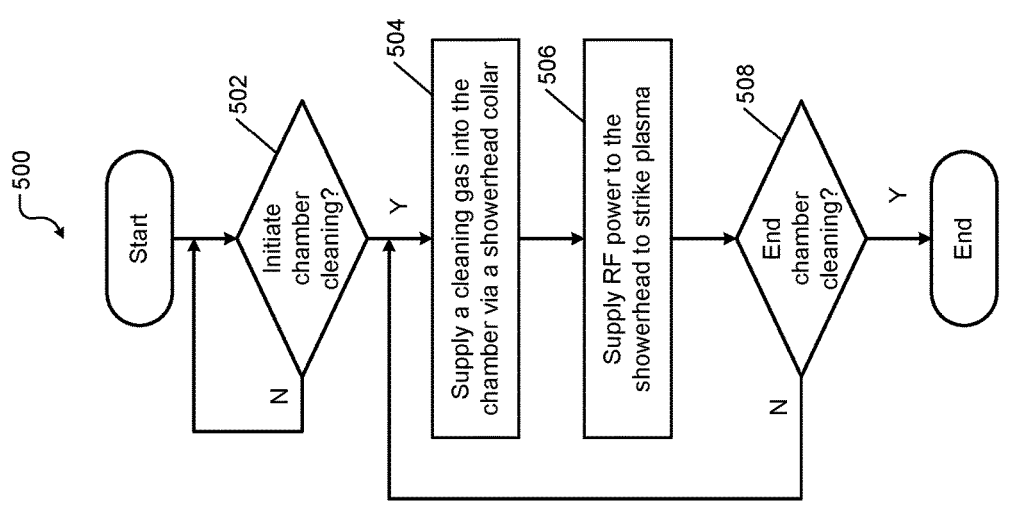

FIG. 5 shows a second method 500 for cleaning the areas above and over the backside of the showerhead 140 and in the processing chamber 108. The method 500 is performed by the controller 150. At 502, the method 500 determines whether to clean the processing chamber 108. At 504, if the processing chamber 108 is to be cleaned, the method 500 initially turns off the supply of the process gas and the purge gas respectively to the showerhead 140 and the collar 142, which are used while processing substrates in the processing chamber 108. The method 500 then supplies the cleaning gas into the processing chamber 108 via the collar 142 of the showerhead 140. At this point, no fluid is supplied to the showerhead 140 and into the processing chamber 108 through the showerhead 140.

At 506, the method 500 supplies RF power to the showerhead 140 while supplying the cleaning gas to the collar 142. The pedestal and/or the chamber body are grounded. The RF power activates the cleaning gas that is dispersing through the collar 142 above and over the backside of the showerhead 140 and into the processing chamber 108. The activated cleaning gas reacts with any residue that may have been deposited in these areas while processing substrates and cleans these areas.

The method 500 supplies the cleaning gas to the collar 142 and activates the cleaning gas in the processing chamber 108 for a predetermined time period within which the cleaning operation is completed. At 508, the method 500 checks whether the predetermined time period has elapsed, after which the method 500 stops the cleaning operation. At this point, the method 500 stops supplying the cleaning gas to the collar 142 and also stops supplying the RF power to the showerhead 140 to activate the cleaning gas. Subsequently, substrates can be processed in the processing chamber 108, and the process gas and the purge gas can be respectively supplied to the showerhead 140 and the collar 142 while processing the substrates.

Figure 6:
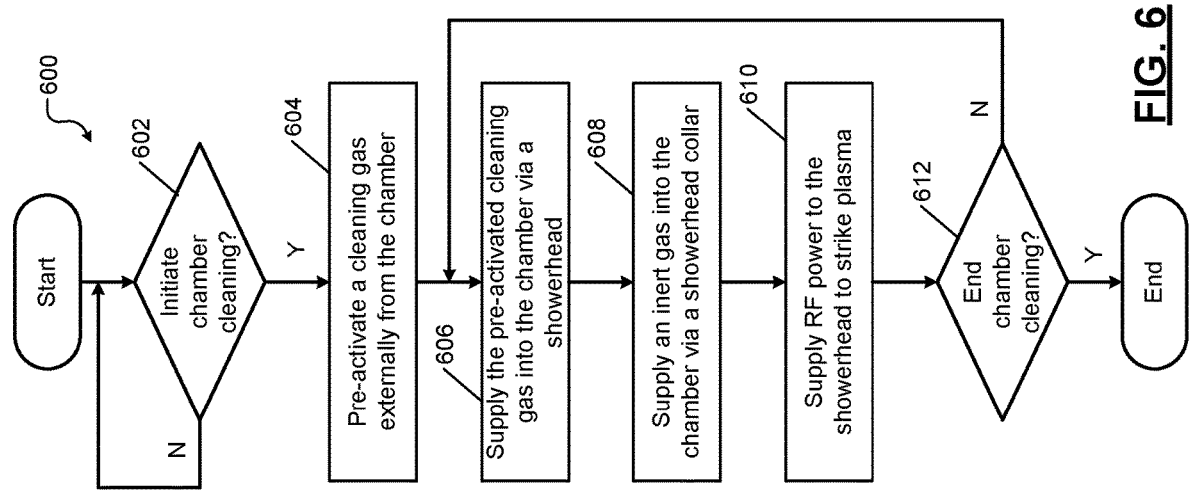
FIG. 4-6 show various methods of cleaning the processing chamber in the substrate processing system of FIG. 1 using the collar of FIG. 2 and the valve arrangement of FIG. 3.
Figure 7:
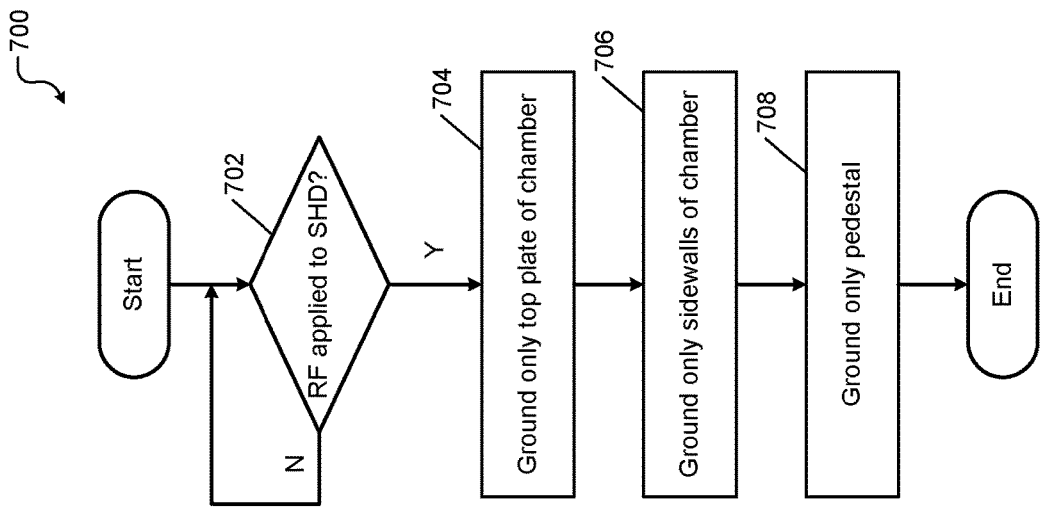

FIG. 6 shows a third method 600 for cleaning the areas above and over the backside of the showerhead 140 and in the processing chamber 108. The method 600 is performed by the controller 150. At 602, the method 600 determines whether to clean the processing chamber 108. At 604, if the processing chamber 108 is to be cleaned, the method 600 initially turns off the supply of the process gas and the purge gas respectively to the showerhead 140 and the collar 142, which are used while processing substrates in the processing chamber 108. The method 600 then pre-activates the cleaning gas in the remote plasma generator 182.

At 606, the method 600 supplies the pre-activated cleaning gas from the remote plasma generator 182 to the showerhead 140 and into the processing chamber 108 through the showerhead 140. At 608, the method 600 additionally supplies an inert gas to the collar 142 of the showerhead 140 and into the processing chamber 108 via the collar 142. At 610, the method 600 supplies RF power to the showerhead 140 while supplying the inert gas to the collar 142 and while supplying the pre-activated cleaning gas to the showerhead 140. The pedestal and/or the chamber body are grounded.

The RF power activates the inert gas that is dispersing through the collar 142 above and over the backside of the showerhead 140 and into the processing chamber 108. The activated inert gas allows the pre-activated cleaning gas to react with any residue that may have been deposited above and over the backside of the showerhead 140 and elsewhere in the processing chamber 108 and to clean these areas.

The method 600 supplies the pre-activated cleaning gas and the inert gas respectively to the showerhead 140 and the collar 142, and activates the inert gas for a predetermined time period within which the cleaning operation is completed. At 612, the method 600 checks whether the predetermined time period has elapsed, after which the method 600 stops the cleaning operation. At this point, the method 600 stops supplying the pre-activated cleaning gas and the inert gas respectively to the showerhead 140 and the collar 142, and also stops supplying the RF power to the showerhead 140 to activate the inert gas. Subsequently, substrates can be processed in the processing chamber 108, and the process gas and the purge gas can be respectively supplied to the showerhead 140 and the collar 142 while processing the substrates.

FIG. 7 shows a first example of a method 700 that can be used to ground different portion of the processing chamber 108 during the cleaning of the processing chamber 108. The method 700 is performed by the controller 150 while performing the methods 500 and 600. At 702, the method 700 determines whether RF power is supplied to the showerhead 140 (e.g., elements 506 and 610 of FIGS. 5 and 6). At 704, if RF power is supplied to the showerhead 140, the method 700 grounds only the top plate 109 of the processing chamber 108 that is above the showerhead 140 by turning on the switch 350 and turning off switches 352 and 354. At 706, the method 700 grounds only the sidewalls 111 of the processing chamber 108 by turning on the switch 352 and turning off switches 350 and 354. At 708, the method 700 grounds only the pedestal 104 by turning on the switch 354 and turning off switches 350 and 352.

FIG. 8 shows a second example of a method 800 that can be used to ground different portion of the processing chamber 108 during the cleaning of the processing chamber 108. The method 800 is performed by the controller 150 while performing the methods 500 and 600. At 802, the method 800 determines whether RF power is supplied to the showerhead 140 (e.g., elements 506 and 610 of FIGS. 5 and 6). At 804, if RF power is supplied to the showerhead 140, the method 800 initially grounds only the top plate 109 of the processing chamber 108 that is above the showerhead 140 by turning on the switch 350 and turning off switches 352 and 354. At 806, the method 800 additionally grounds only the sidewalls 111 of the processing chamber 108 by turning on the switch 352 while keeping the switch 350 turned on and switch 354 turned off. At 808, the method 800 additionally grounds the pedestal 104 by turning on the switch 354 while keeping switches 350 and 352 turned on.

Figure 9:
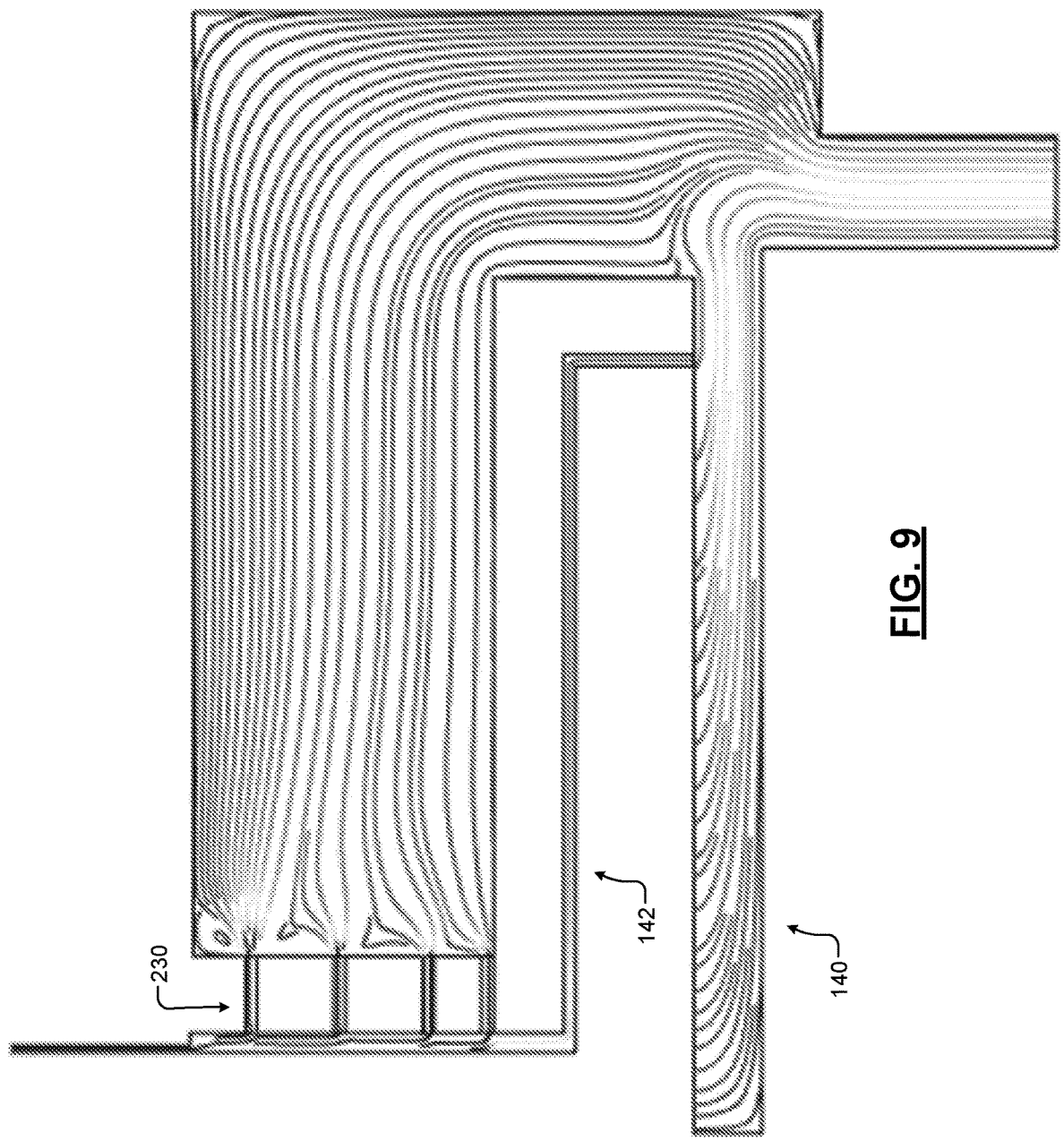
FIG. 9 shows a flow model for the processing chamber.
Figure 10:
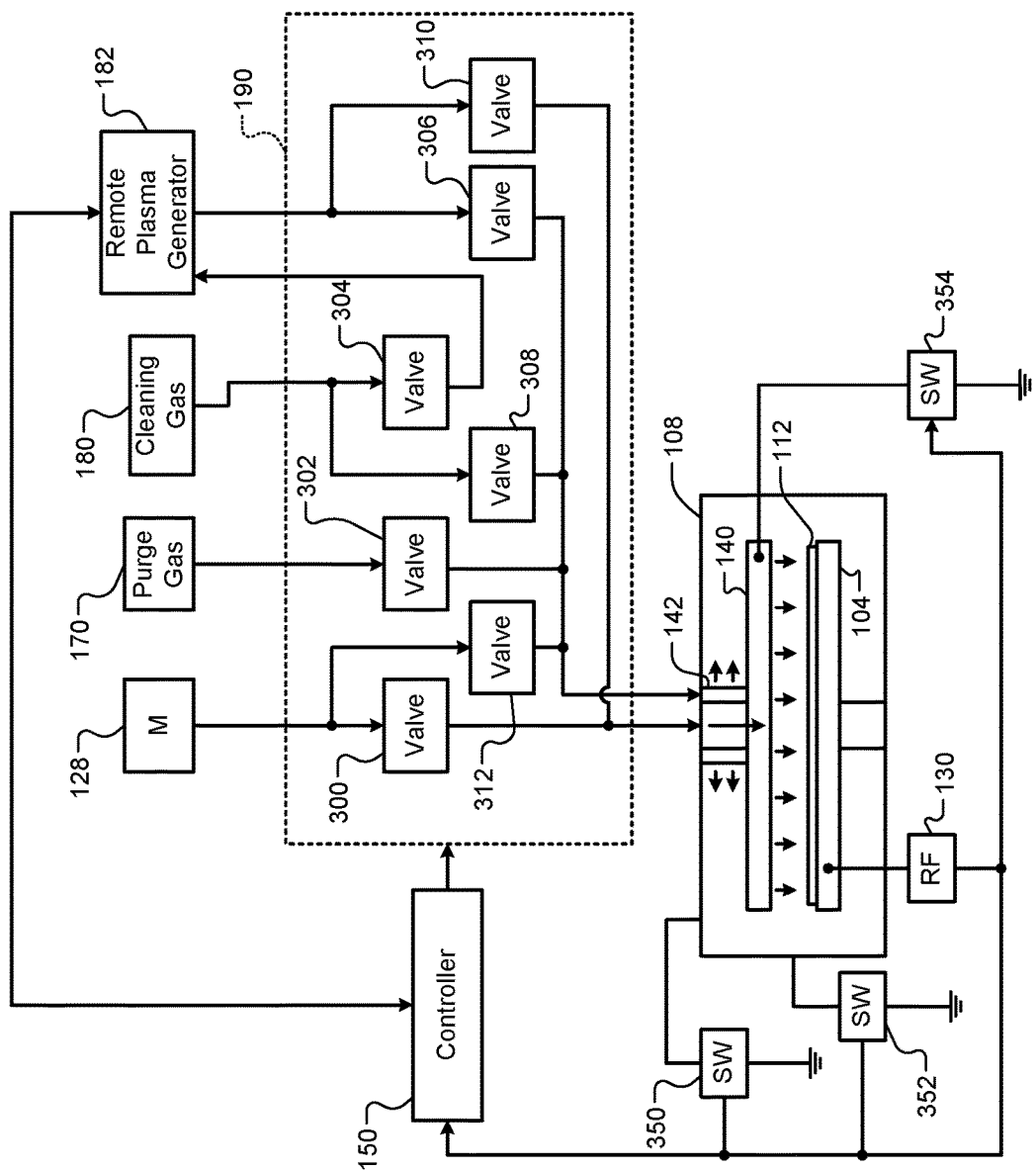
FIG. 10 shows an alternate configuration of FIG. 3 with grounded showerhead and powered pedestal.

FIG. 9 shows a flow model for the processing chamber 108. The flow model demonstrates that fluids such as the purge gas flow without recirculation near the edge of the showerhead while processing substrates in the processing chamber 108. The flow model also demonstrates that fluids such as the cleaning gas and the inert gas used during the different cleaning methods flow without recirculation near the edge of the showerhead.

FIG. 10 shows an alternate configuration of FIG. 3 with grounded showerhead and powered pedestal. In some implementations, instead of supplying RF power to the showerhead and grounding the pedestal, the RF power may be supplied to the pedestal, and the showerhead may be grounded. All elements of FIG. 10 are identical to FIG. 3 except that the RF generating system 130 supplies RF power to the pedestal 104, and the switch 354 is controlled to ground the showerhead 140.

During cleaning, the externally pre-activated cleaning gas can be injected into the chamber through the collar as described above. Alternatively, the cleaning gas can be injected into the chamber through the collar, and plasma can be struck by supplying RF power to the pedestal. Alternatively, the externally pre-activated cleaning gas can be injected into the chamber through the showerhead, inert gas can be injected through the collar, and plasma can be struck by supplying RF power to the pedestal. Further, in each of these alternatives, the showerhead and the top plate and sidewalls of the chamber can be sequentially grounded in a similar manner as described above, except that the showerhead is now grounded instead of the pedestal.

Further, in either configuration (powered showerhead with grounded pedestal, or grounded showerhead and powered pedestal), the pedestal may include an electrostatic chuck, a vacuum chuck, or no chucking feature (gravity keeping the wafer in contact with the pedestal). Furthermore, the RF power supplied to the showerhead or the pedestal may include high frequency (3 to 60 MHz) and low frequency (100 to 1000 KHz).

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each embodiment is described as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a pedestal, a gas flow system, etc.). These systems may be integrated with electronics for controlling their operation before, during, and after processing of a semiconductor wafer or substrate. The electronics may be referred to as the "controller," which may control various components or subparts of the system or systems.

The controller, depending on the processing requirements and/or the type of system, may be programmed to control any of the processes disclosed herein, including the delivery of processing gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software).

Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control.

Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A system for cleaning a processing chamber, comprising:
   a showerhead that is arranged above a pedestal in the processing chamber, wherein the showerhead includes:
      a stem portion that is connected to a top plate of the processing chamber and that receives a process gas during processing of a substrate mounted on the pedestal; and
      a head portion that includes a plurality of through holes to disperse the process gas during the processing of the substrate;
   a collar that surrounds the stem portion of the showerhead, that defines a cavity, and that includes a plurality of slots extending outwardly from the cavity to disperse a purge gas during the processing of the substrate;
   a manifold to supply the process gas;
   a first gas source to supply the purge gas;
   a second gas source to supply a cleaning gas;
   a plasma generator external to the processing chamber to receive the cleaning gas from the second gas source and to generate plasma;
   a plurality of valves connected between the showerhead and the collar and each of the manifold, the first and second gas sources, and the plasma generator; and
   a controller programmed to control the plurality of valves to:
      during substrate processing, turn on supply of the process gas from the manifold to the showerhead and supply of the purge gas from the first gas source to the collar, and turn off supply of the cleaning gas from the second gas source and supply of plasma from the plasma generator; and
      during cleaning operation, turn off supply of the process gas from the manifold to the showerhead and supply of the purge gas from the first gas source to the collar, and turn on supply of the cleaning gas from the second gas source to the plasma generator and supply of the plasma from the plasma generator to the collar and into the processing chamber through the slots to clean areas around the showerhead and in the processing chamber.

2. The system of claim 1 wherein the cleaning gas supplied during the cleaning is different than the purge gas supplied during the processing of the substrate.

3. The system of claim 1 wherein the cleaning gas includes a halogen species.

4. The system of claim 1 wherein the cleaning gas includes nitrogen trifluoride ($NF_3$) or tetrafluoroethylene ($C_2F_4$).

5. The system of claim 1 wherein the controller is configured to supply the plasma for a predetermined period of time.

6. The system of claim 1 wherein prior to and subsequent to the cleaning of the processing chamber, the controller is configured to:
   stop supplying the plasma to the collar; and
   supply the process gas and the purge gas respectively to the stem portion of the showerhead and the collar to process the substrate.

7. A system for cleaning a processing chamber, comprising:
   a showerhead that is arranged above a pedestal in the processing chamber, wherein the showerhead includes:
      a stem portion that is connected to a top plate of the processing chamber and that receives a process gas during processing of a substrate mounted on the pedestal; and
      a head portion that includes a plurality of through holes to disperse the process gas during the processing of the substrate;
   a collar that surrounds the stem portion of the showerhead, that defines a cavity, and that includes a plurality of slots extending outwardly from the cavity to disperse a purge gas during the processing of the substrate;
   a manifold to supply the process gas;
   a first gas source to supply the purge gas;
   a second gas source to supply a cleaning gas;
   an RF generator to supply RF power; and
   a plurality of valves connected between the showerhead and the collar and each of the manifold and the first and second gas sources; and
   a controller programmed to control the plurality of valves to:
      during substrate processing, turn on supply of the process gas from the manifold to the showerhead and supply of the purge gas from the first gas source to the collar, and turn off supply of the cleaning gas from the second gas source;
      during cleaning operation, turn off supply of the process gas from the manifold to the showerhead and supply of the purge gas from the first gas source to the collar, and turn on supply of the cleaning gas from the second gas source to the collar and into the processing chamber through the slots of the collar; and
      supply the RF power to the showerhead to generate plasma in the processing chamber to clean areas around the showerhead and in the processing chamber.

8. The system of claim 7 wherein the cleaning gas supplied during the cleaning is different than the purge gas supplied during the processing of the substrate.

9. The system of claim 7 wherein the cleaning gas includes a halogen species.

10. The system of claim 7 wherein the cleaning gas includes nitrogen trifluoride ($NF_3$) or tetrafluoroethylene ($C_2F_4$).

11. The system of claim 7 wherein the controller is configured to supply the RF power to the showerhead for a predetermined period of time.

12. The system of claim 7 wherein the controller is configured to sequentially ground the top plate of the processing chamber, sidewalls of the processing chamber, and the pedestal.

13. The system of claim 7 wherein the controller is configured to ground the top plate of the processing chamber, sidewalls of the processing chamber, and the pedestal.

14. The system of claim 7 wherein prior to and subsequent to the cleaning of the processing chamber, the controller is configured to:
   stop supplying the cleaning gas to the collar; and
   supply the process gas and the purge gas respectively to the stem portion of the showerhead and the collar to process the substrate.

15. A system for cleaning a processing chamber, comprising:
   a showerhead that is arranged above a pedestal in the processing chamber, wherein the showerhead includes:
      a stem portion that is connected to a top plate of the processing chamber and that receives a process gas during processing of a substrate mounted on the pedestal; and
      a head portion that includes a plurality of through holes to disperse the process gas during the processing of the substrate;
   a collar that surrounds the stem portion of the showerhead, that defines a cavity, and that includes a plurality of slots extending outwardly from the cavity to disperse a purge gas during the processing of the substrate;
   a manifold to supply the process gas;
   gas sources to supply a cleaning gas and an inert gas;
   a plasma generator external to the processing chamber to receive the cleaning gas and to generate a first plasma; and
   an RF generator to supply RF power;
   a plurality of valves connected between the showerhead and the collar and each of the manifold, the gas sources, and the plasma generator; and
   a controller programmed to control the plurality of valves to:
      during substrate processing, turn on supply of the process gas from the manifold to the showerhead and supply of the purge gas to the collar and turn off supply of the cleaning gas and supply of the first plasma; and
      during cleaning operation, turn off supply of the process gas from the manifold to the showerhead and supply of the purge gas to the collar, and turn on supply of the first plasma to the stem portion of the showerhead and into the processing chamber through the plurality of through holes in the head portion of the showerhead;
      turn on supply of the inert gas to the collar and into the processing chamber through the slots of the collar; and
      supply the RF power to the showerhead to generate a second plasma in the processing chamber to clean areas around the showerhead and in the processing chamber.

16. The system of claim 15 wherein the cleaning gas and the inert gas supplied during the cleaning are respectively different than the process gas and the purge gas supplied during the processing of the substrate.

17. The system of claim 15 wherein the cleaning gas includes a halogen species.

18. The system of claim 15 wherein the cleaning gas includes nitrogen trifluoride ($NF_3$) or tetrafluoroethylene ($C_2F_4$).

19. The system of claim 15 wherein the inert gas is selected from a group consisting of argon (Ar), molecular nitrogen ($N_2$), and helium (He).

20. The system of claim 15 wherein the controller is configured to supply the first plasma and the inert gas respectively to the stem portion of the showerhead and the collar for a predetermined period of time.

21. The system of claim 15 wherein the controller is configured to sequentially ground the top plate of the processing chamber, sidewalls of the processing chamber, and the pedestal.

22. The system of claim 15 wherein the controller is configured to ground the top plate of the processing chamber, sidewalls of the processing chamber, and the pedestal.

23. The system of claim 15 wherein prior to and subsequent to the cleaning of the processing chamber, the controller is configured to:

stop supplying the first plasma and the inert gas respectively to the stem portion of the showerhead and the collar; and supply the process gas and the purge gas respectively to the stem portion of the showerhead and the collar to process the substrate.

24. The system of claim 1 wherein the controller is configured to sequentially ground the top plate of the processing chamber, sidewalls of the processing chamber, and the pedestal.

25. The system of claim 1 wherein the controller is configured to ground the top plate of the processing chamber, sidewalls of the processing chamber, and the pedestal.

* * * * *